United States Patent [19]
Yoshida

[11] Patent Number: 4,758,984
[45] Date of Patent: Jul. 19, 1988

[54] SEMICONDUCTOR MEMORY DEVICE INCLUDING READ ONLY MEMORY ELEMENT FOR STORING FIXED INFORMATION

[75] Inventor: Masanobu Yoshida, Kawaguchi, Japan

[73] Assignee: Fujitsu Limited, Kanagawa, Japan

[21] Appl. No.: 941,865

[22] Filed: Dec. 15, 1986

[30] Foreign Application Priority Data

Dec. 18, 1985 [JP] Japan .................. 60-282739

[51] Int. Cl.$^4$ ........................... G11C 11/40
[52] U.S. Cl. ........................ 365/53; 365/185; 365/104
[58] Field of Search ............... 365/53, 104, 185

[56] References Cited

U.S. PATENT DOCUMENTS

4,519,050 5/1985 Folmsbee .............. 365/53
4,530,074 7/1985 Folmsbee .............. 365/53

FOREIGN PATENT DOCUMENTS

58-197777 11/1983 Japan .
59-6581 1/1984 Japan .

Primary Examiner—James W. Moffitt
Attorney, Agent, or Firm—Armstrong, Nikaido, Marmelstein & Kubovcik

[57] ABSTRACT

A semiconductor memory device including a substrate having one conductivity type; read only memory element formed in the substrate for storing fixed information, the element having a control gate, a floating gate, a source region, and a drain region, both of the regions having an opposite conductivity type to that of the substrate; a first region having the above one conductivity type which surrounds the element; a light shield layer, connected to the source region and the first region, for covering the element; a second region having the opposite conductivity type which is located outside of the first region for taking out the drain region; and a well region having the opposite conductivity type, the well region linking the drain region and the second region, a part of the first region being formed in the well.

6 Claims, 6 Drawing Sheets

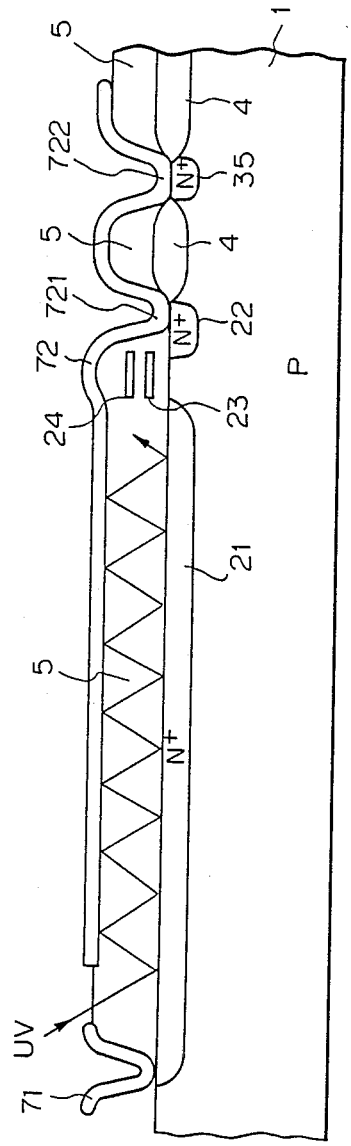
Fig. 3 (PRIOR ART)
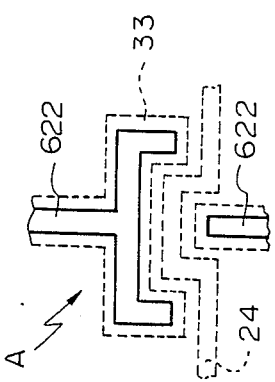
Fig. 10
Fig. 8

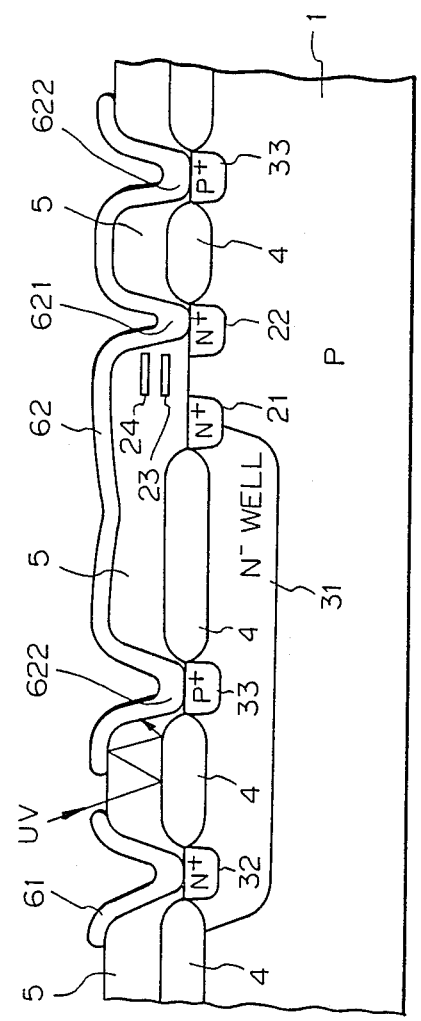

SEMICONDUCTOR MEMORY DEVICE INCLUDING READ ONLY MEMORY ELEMENT FOR STORING FIXED INFORMATION

BACKGROUND OF THE INVENTION

1. Field of the Invention

The present invention relates to an electrically programmable read only memory (EPROM) and other semiconductor memory devices, in particular to an improvement of the light shielding structure of a cell transistor comprising a ROM for storing fixed information, e.g., a ROM for storing malfunctional addresses, provided for such semiconductor memory devices.

2. Description of the Related Art

In general, in an EPROM or other semiconductor memory device, in the program mode, predetermined data is programmed from a data programming circuit to a memory cell by storing, or not storing, electric charges in the floating gate of the cell transistor constituting the memory cell. On the other hand, in the read mode, the data programmed in the cell transistor is read out by sensing whether such electric charges are stored in the floating gate of the cell transistor constituting the selected memory cell.

To erase the data programmed in the cell transistors, i.e., to eliminate the charges stored in the floating gates of the cell transistors, ultraviolet light is irradiated over the entire chip on which the memory cell is formed from above the silicon insulating film formed on the silicon substrate.

Semiconductor memory devices are in general provided with a ROM for storing malfunctional addresses, for example, row addresses including malfunctional memory cells, of the memory cell array. When an address signal, for example, row address signal, corresponding to a malfunctional address is input from outside, a redundant memory cell is selected and the memory cell corresponding to that malfunctional row address is not selected.

Recent ROM's for storing malfunctional addresses have been provided with floating gate type cell transistors of the same type as the cell transistors constituting the above-mentioned EPROM memory cells. Each bit constituting a malfunctional address is stored as fixed information by storing, or not storing, electric charges in the floating gate of the respective cell transistor.

When erasing the above-mentioned programmed data, however, i.e., when irradiating ultraviolet light on the cell transistors constituting the EPROM, the ultraviolet light must be prevented from also erasing the data programmed in the cell transistors constituting the ROM for storing malfunctional addresses, i.e., the data indicating the malfunctional addresses and other fixed data.

Therefore, in the past, consideration has been given to covering the surface of the cell transistors constituting the ROM for storing malfunctional addresses, i.e., the surface of silicon insulating film, with a light shield layer made of, for example, aluminum, so as to shield the cell transistors of the ROM for storing malfunctional addresses from the ultraviolet light.

In the prior art construction, however, the ultraviolet light would penetrate into the space between the drain terminal and the light shield layer, i.e., source terminal, of the cell transistors of the ROM for storing malfunctional addresses and through the silicon insulating film, i.e., phosphor silicate glass film, to reach the cell transistor portions. Of course, if the light shield layer covered a sufficient distance, the ultraviolet light which did make its way in from that space would gradually attenuate before reaching the cell transistor portions, but to ensure sufficient attenuation effect, a distance of coverage of a large value of, for example, several hundred microns, was necessary. The need to make the light shield layer such a large area resulted in the cell transistors constituting the ROM for storing malfunctional addresses being extremely large in size.

This problem is not limited to ROM's for storing malfunctional addresses, but is a common one for all ROM's for storing fixed information using an EPROM cell construction. For example, even when providing an EPROM with a ROM for storing hysteresis of the production process, test data, information regarding the type or product number of the memory device itself, or other fixed information, if that ROM is constructed with double gate transistors provided with floating gates like the EPROM cells, a light shield layer would be necessary and the above problem would occur.

SUMMARY OF THE INVENTION

The present invention was made to resolve the above-mentioned problem and has as its object the reliable prevention of erasure by ultraviolet light of fixed information, such as malfunctional addresses, set in the cell transistors constituting a ROM for storing malfunctional addresses and other fixed information without increasing the size of the cell transistors of the ROM.

The present invention resolves the problem by the provision of a semiconductor memory device including a substrate having one conductivity type; a read only memory element formed in the substrate for storing fixed information, the element having a control gate, a floating gate, a source region, and a drain region, both of said regions having an opposite conductivity type to that of the substrate; a first region having the above one conductivity type which surrounds the element; a light shield layer, connected to the source region and the first region, for covering the element; a second region having the opposite conductivity type which is located outside of the first region for taking out the drain region; and a well region having the opposite conductivity type, the well region linking the drain region and the second region, a part of the first region being formed in the well.

According to the above construction, the element, i.e., cell transistor portion, constituting the ROM for storing malfunctional addresses is completely sealed from the outside by the light shield layer, which contacts the source region and the first region, provided in the well. Therefore, it is possible to completely prevent intrusion of ultraviolet light without increasing the distance from the source region to the first region and to the second region. Further, in the well, the second region (high potential side) from which the drain terminal is taken out has the same conductivity type (N+) as the drain region, while, in the well, the first region (ground side) to which the light shield layer (used concurrently as source terminal) is connected is formed of the opposite conductivity type (P+) to that the drain region, so the first and second regions formed in the well are subjected to a reverse bias potential and short-circuits between the first and second regions through the well can be prevented.

BRIEF DESCRIPTION OF THE DRAWINGS

The present invention will become clearer by way of the following description made in reference to the accompanying drawings, wherein:

FIG. 3 is a cross-sectional view of a ROM for storing fixed information used for a semiconductor memory device in the prior art;

FIG. 7 is a cross-sectional view along line Y—Y of the ROM for storing fixed information shown in FIG. 6;

FIG. 8 is a partial plan view showing a modification of portion A of the ROM for storing fixed information shown in FIG. 6;

FIG. 10 is an equivalent circuit diagram of the ROM for storing fixed information shown in FIG. 6 to FIG. 9.

DESCRIPTION OF THE PREFERRED EMBODIMENTS

Figure 1:
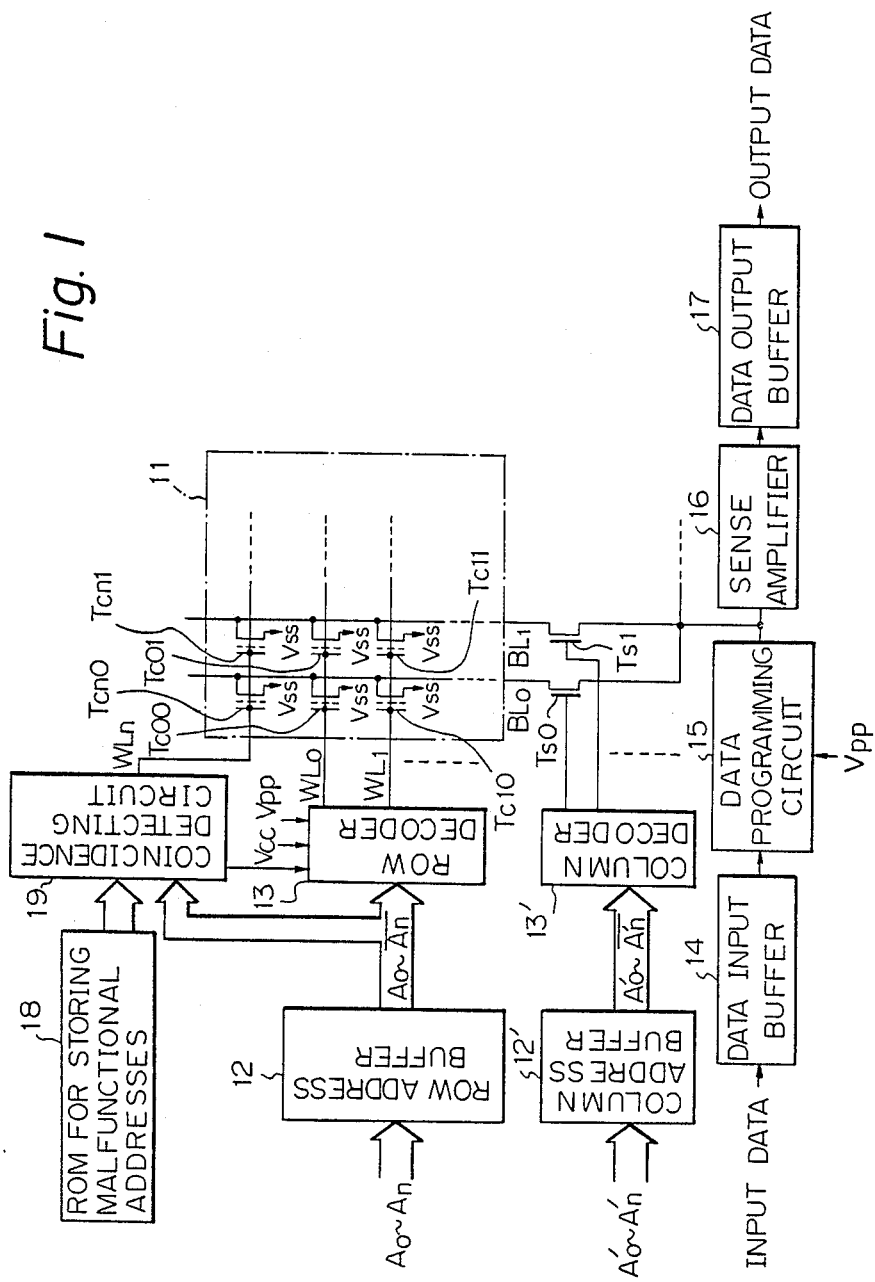
FIG. 1 is a view illustrating the overall construction of a semiconductor memory device provided with a ROM for storing fixed information.

To clarify the background of the present invention further, an example of the overall construction of this type of semiconductor memory device is shown schematically in FIG. 1. In FIG. 1, reference numeral 11 represents a memory cell array including a predetermined number of cell transistors $T_{C00}$, $T_{C01}$, ...; $T_{C10}$, $T_{C11}$ ...; $T_{Cn0}$, $T_{Cn1}$ ...; etc., wherein $T_{Cn0}$, $T_{Cn1}$ ... represent the cell transistors constituting a redundant circuit. Reference numeral 12 is a row address buffer, which row address buffer 12 shapes the waveforms of the row address bit signals $A_0$ to $A_n$ input therein and outputs internal row address bit signals $A_0$, $\overline{A}_0$ (inverted signal of $A_0$) to $A_n$, $\overline{A}_n$. Reference numeral 13 is a row decoder, which selects a specific word line, for example, $WL_0$, in accordance with the output states of the internal row address bit signals, and sets the potential of the selected word line to, for example, the high level and the potential of the other nonselected word lines to, for example, the low level. Note that the word line $WL_n$ is connected to the output side of the coincidence detecting circuit 19. In a program mode, the potential of the selected word line is raised, for example, 12.5 V, by the programming DC power supply $V_{pp}$, while, in a read mode, the potential of the selected word line is raised, for example, 5 V by the read DC power supply $V_{cc}$. The word line $WL_0$ is connected to the control gates of the cell transistors $T_{C00}$, $T_{C01}$, ..., while the word line $WL_1$ is connected to the control gates of the cell transistors $T_{C10}$, $T_{C11}$, ..., and so on.

On the other hand, reference numeral 12' is a column address buffer, which column address buffer 12' shapes the waveforms of the column address bit signals $A'_0$ to $A'_n$ input thereto and outputs internal column address bit signals $A'_0$, $\overline{A}'_0$, to $A'_n$, $\overline{A}'_n$. Reference numeral 13' is a column decoder, which selects a specific bit line, for example, $BL_0$ in accordance with the output states of the internal column address bit signals and supplies, for example, a high potential selection signal to the gate of the transfer gate transistors, for example, $T_{S0}$, connected to the selected bit line and sets the gate potential of the transfer gate transistors, for example, $T_{S1}$, connected to the other nonselected bit lines to the low level.

In the memory cell array 11, the cell transistors $T_{C00}$, $T_{C01}$, ...; $T_{C10}$, $T_{C11}$ ...; and $T_{Cn0}$, $T_{Cn1}$ ... constituting the memory cells are provided with floating gates (shown by dotted lines) in addition to the control gates connected to the word lines.

When programming data "0" is programmed into a predetermined cell transistor, for example, $T_{C00}$, a bit line $BL_0$ is selected by the column decoder 13', a word line $WL_0$ is selected by the row decoder 13, and a predetermined high potential (for example, 12.5 V) is applied to the control gate of the cell transistor $T_{C00}$. On the other hand, the programming data "0", in the program mode, is input to the data programming circuit 15 via the data input buffer 14, whereby the potential of the output side of the data programming circuit 15 is made high level (for example, 7.5 V), the cell transistor $T_{C00}$ is made conductive, and the hot electrons generated by the ensuing avalanche breakdown are stored in the floating gate of the cell transistor $T_{C00}$. As a result, cell transistors in which data "0" is programmed do not become conductive during the read mode even when the predetermined read potential (for example, 5 V) is applied to the control gates thereof through the word lines. By detecting this nonconductive state of the cell transistors, the fact that the data stored in the corresponding cell transistor is "0" is read out via a sense amplifier 16 and data output buffer 17.

On the other hand, when programming data "1" is programmed into a predetermined cell transistor, the output side of the data programming circuit 15 enters a floating state, whereby, during data programming, the cell transistor $T_{C00}$ does not become conductive and no electrons are stored in the floating gate. Therefore, cell transistors in which data "1" is programmed become conductive during the read mode through application of the above predetermined read potential to the control gates via the word lines. By detecting this conductive state of the cell transistors, the fact that the data stored in the corresponding cell is "1" is read out.

Reference numeral 18 is a ROM for storing malfunctional addresses, which is constituted to store and output the address signal corresponding to a malfunctional address, in this case, a row address including a malfunctional memory cell, in the memory cell array 11. Therefore, when a row address signal corresponding to the malfunctional address is output from the row address buffer 12, the coincidence detecting circuit 19 detects the coincidence between the row address signal and the malfunctional address signal and the output side, i.e., the word line $WL_n$ becomes high level in potential, and the redundant memory cell connected to the word line $WL_n$ is selected. Further, as a result of the signal output from the coincidence detecting circuit 19, the word line corresponding to the malfunctional row address is not selected.

Figure 2A:
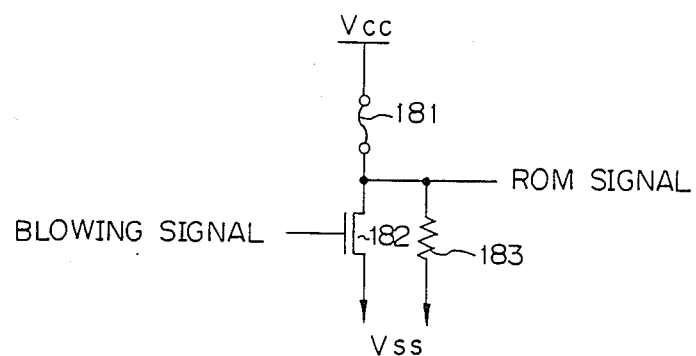
FIGS. 2A and 2B are circuit diagrams illustrating the internal construction of the ROM for storing fixed information shown in FIG. 1.
Figure 2B:
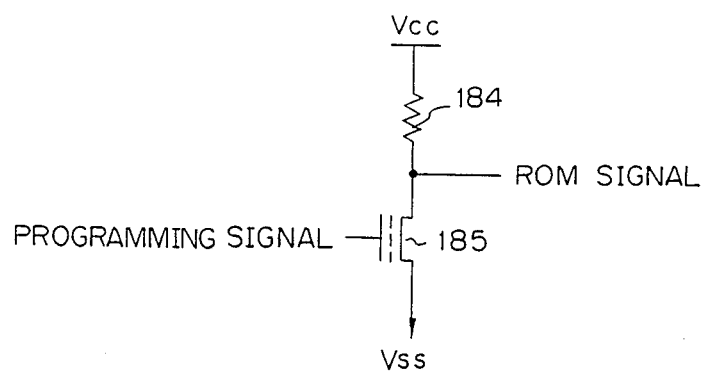

FIGS. 2A and 2B are circuit diagrams illustrating the internal constitution of a ROM 18 for storing malfunctional addresses. FIG. 2A shows a so-called fuse ROM which uses a polycrystalline silicon fuse 181. When the gate of the transistor 182 is supplied with a low level signal to make the transistor 182 nonconductive, the signal of the output side, i.e., ROM signal, becomes high potential, that is, "1". When the gate of the transistor 182 is supplied with a high potential blowing signal, the transistor 182 becomes conductive and the fuse 181 is blown. A pulldown resistor 183 is provided, so the signal of the output side becomes low potential, that is, "0". By providing a number of such circuits corresponding to the number of bits of the row bit address signals, it is possible to fix each bit constituting the row malfunctional address at "1" or "1". However, such a destructive type memory element using blown fuses suffers from the shortcoming of low reliability, e.g., the fuses sometimes become conductive after having once been blown.

Recently, as shown in FIG. 2B, consideration has been given to the use of a transistor 185 provided with a floating gate, such as used in EPROM memory cells, for ROM's for storing malfunctional addresses. In this case, when the control gate of the transistor 185 is supplied with a potential of, usually, $V_{cc}$, for example, 5 V, the transistor 185 becomes conductive, and the signal of the output side becomes low potential, that is, "0". However, once a high potential, for example, 12.5 V, is applied to the control gate of the transistor 185, the floating gate of the transistor 185 accumulates electrons and the transistor 185 becomes nonconductive. Further, by provision of a pullup resistor 184, the signal of the output side is made high potential, that is, "1". That is, by using a nondestructive type memory element such as shown in FIG. 2B, it is possible to construct a ROM for storing malfunctional addresses having a high reliability.

However, in general, in an EPROM or other semiconductor memory device, when erasing data programmed into the cell transistors constituting the EPROM, that is, the electric charges stored in the floating gates of the cell transistors, the erasure is performed by irradiating the entire chip from above the silicon oxide insulating film with ultraviolet light. In irradiating the chip with the ultraviolet light to erase the programmed data, however, the data programmed into the cell transistors (corresponding to 185) constituting the ROM for storing malfunctional addresses, i.e., the data indicating the malfunctional addresses, must be prevented from being erased by the ultraviolet light. Therefore, in the past, as shown by FIG. 3, for example, consideration has been given to sealing the cell transistors of the ROM from ultraviolet light by covering the surface of the cell transistors, i.e., the surface of the silicon insulating film 5, with a light shield layer 72, constituted of, for example, aluminum.

In FIG. 3, reference numeral 1 is a P type substrate and 21, 22, 23, and 24 are a drain diffusion region, source diffusion region, floating gate, and control gate of an EPROM transistor constituting the ROM for storing malfunctional addresses, respectively. Reference numeral 4 is a field insulating film, 5 a phosphor silicate glass (PSG) film on the silicon substrate surface, and 71 a drain terminal. Reference numeral 72 is the light shield layer, provided on the surface of the PSG film 5, which contacts the source diffusion region 22 at the contact portion 721 and serves also as a source terminal. In this case, in the prior art shown in FIG. 3, the light shield layer 72 also contacts the N+ type diffusion region 35 for the contact at the right side of the source terminal contact portion 721, i.e., at the contact portion 722, so as to completely close the space between the silicon substrate surface and the light shield layer 72 and leave no room for the intrusion of ultraviolet light. However, at the left side of the source terminal portion 721, that is, above the drain diffusion region, contact may not be made with the drain diffusion region. Namely, the left end of the light shield layer 72 and the silicon substrate surface are open, with the PSG film interposed.

Figure 4:
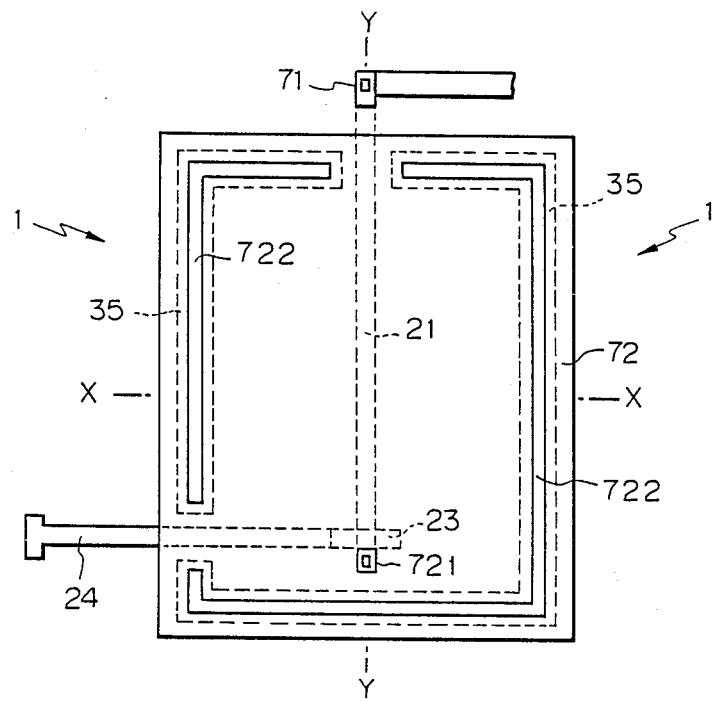
FIG. 4 is a plan view of the specific constitution of the ROM for storing fixed information shown in FIG. 3, FIG. 3 being a cross-section of FIG. 4 taken along line Y—Y.
Figure 5:
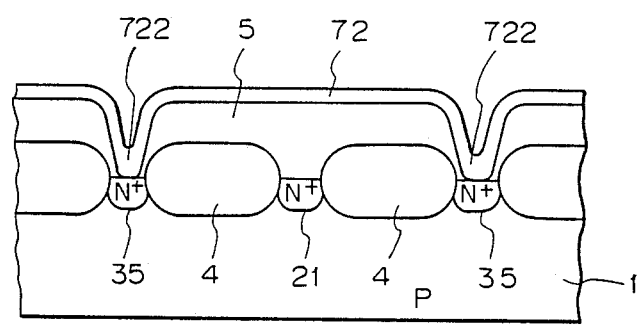
FIG. 5 is a cross-sectional view taken along line X—X of the ROM for storing fixed information shown in FIG. 4.

FIG. 4 is a plan view of the cell transistor shown in FIG. 3, while FIG. 5 is a cross-sectional view along line X—X of FIG. 4. As shown in FIGS. 4 and 5, at the left and right, the light shield layer 72 seals off the silicon substrate 1 at the contact portions 722, except at the takeout portion of the control gate 24.

However, in the conventional structure as shown in FIG. 3 to FIG. 5, a portion of the ultraviolet light irradiated on the EPROM proper passes from the space between the drain terminal 71 and light shield layer 72 (source terminal), as shown by UV in the figure, through the PSG film 5 to penetrate to the cell transistor portion constituting the ROM for storing malfunctional addresses. Of course, as shown in FIG. 3, if a sufficient distance extending from the source diffusion region 22 leftward is covered by the light shield layer 72, the ultraviolet light UV gradually attenuates with each reflection in the distance before reaching the cell transistor portion. To ensure sufficient attenuation effect, however, the distance of coverage must be a large value of, for example, several hundred microns. Therefore, the drain terminal 71 taken out from the drain diffusion region 21 must be set further leftward. Due to the need of a light shield layer 72 of such a large area, the cell transistors constituting the ROM for storing malfunctional addresses become extremely large.

As mentioned earlier, this problem is not limited to ROM's for storing malfunctional addresses, but is a common one for all ROM's for storing fixed information using an EPROM cell construction. For example, even when providing an EPROM with a ROM for storing the hysteresis of the production process, test data, information regarding the type or product number of the memory device itself or other fixed information, if the ROM is constructed with double gate transistors provided with the floating gates like EPROM cells, a light shield layer would be necessary and the above problem would occur.

Figure 6:
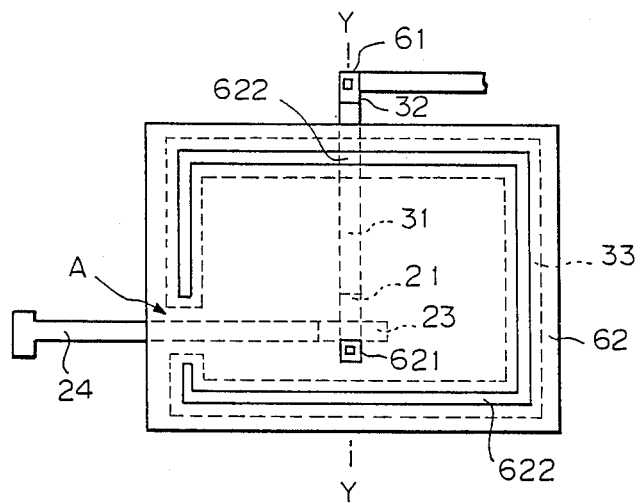
FIG. 6 is a plan view of the specific constitution of a ROM for storing fixed information used for a semiconductor memory device of an embodiment of the present invention.

The present invention was made to resolve the above problem. FIG. 6 is a plan view of a ROM for storing malfunctional addresses according to an embodiment of the present invention. FIG. 7 is a cross-sectional view taken along line Y—Y of FIG. 6. In FIG. 7, reference numeral 1 is a P type substrate and 21, 22, 23, and 24 are an N+ type drain diffusion region, N+ type source diffusion region, floating gate, and control gate of a cell transistor constituting the ROM, respectively. Further, reference numeral 31 is a well, in this case of the N− type, of a usual form in a complementary metal oxide semiconductor (CMOS) type integrated circuit, which well 31 is utilized for electrical connection of the N+ type drain diffusion region 21 and N+ type diffusion region 32 for connection to the drain terminal 61. Reference numeral 61 is a drain terminal formed of aluminum. Reference numeral 33 is a P+ type diffusion region provided between the drain diffusion region 21 and drain terminal connection diffusion region 32 in the N− type well 31, which forms the contact portion of an end of a light shield layer 62, mentioned below. Reference numeral 4 is a field insulating film, and 5 a PSG film.

Reference numeral 62 is a light shield layer formed of aluminum, which contacts the source diffusion region 22 at its contact portion 621 to function as a source terminal and which contacts, at the left, the P+ type diffusion region 33 provided in the well 31 at its contact portion 622, thereby completely sealing the cell transistor portion constituting the ROM for storing malfunctional addresses. Thus, the light shield layer prevents intrusion of ultraviolet light, shown by UV in FIG. 7, irradiating the EPROM as a whole into the cell transistor by the contact portion 622. In this case, the region covered by the light shield layer 62 does not have to be made that large, for example, the distance extending from the source diffusion region to the left can be made several tens of microns. Also, the drain diffusion region 21 and the drain terminal connection diffusion region 32 are connected by the well 31, which has the same conductivity type as those regions, so an electrical circuit is formed from the drain terminal 61 to the drain diffusion region 21.

The well 31 is formed in the process of the formation of the CMOS type EPROM without the need of any special additional processes. Further, the high potential side diffusion region 32 to which the drain terminal 61 is connected is formed in the well 31 with the same conductivity type as that of the drain diffusion region 21 (N+), i.e., an opposite conductivity type to that of the substrate 1, while the (ground side) diffusion region 33, to which the light shield layer 62, serving also as source terminal, is connected is formed with an opposite conductivity type (P+) to that of the source diffusion region 22, i.e., the same conductivity type as that of the substrate 1. Thus, the two diffusion regions 32 and 33 formed in the well 31 are subjected to a reverse bias potential and short-circuiting through the well 31 can be prevented therebetween. Note that in the construction shown in FIG. 7, the light shield layer 62 also contacts the contact use P+ type diffusion region 33 at the right side of the source terminal portion 621, i.e., at the contact portion 622 to close off any space between the silicon substrate surface and the light shield layer 62.

Returning to FIG. 6, a plan view of the ROM for storing malfunctional addresses shown in FIG. 7, as explained above, the light shield layer 62 has the contact portion 622 at the P+ region 33 in the well region 31. Further, to the left and right of the well region 31, the contact portion 622 is made with the light shield layer 62 at the P+ region 33, so as to surround the cell transistor portion, except at the takeout portion of the control gate 24 (region shown by symbol A). Thus, intrusion of ultraviolet light is prevented. It is not possible to seal the takeout portion of the control gate 24 too, but in general while the space between the light shield layer 62 and the substrate surface is about 2 microns, the space between the control gate 24 and the substrate surface is, for example, several hundred angstroms, an extremely small value, and the ultraviolet light intruding through that very small space is almost negligible. Note that, if necessary, the contact portion 622 at the above portion A can be formed to a shape as shown by FIG. 8, for example, and that the control gate can be formed in that space bent in shape, thus further inhibiting the intrusion of ultraviolet light through the portion A.

Figure 9:
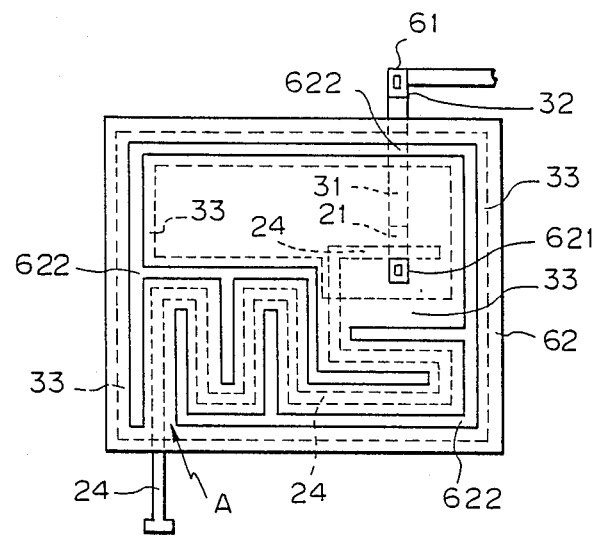
FIG. 9 is a plan view of another modification of the ROM for storing fixed information shown in FIG. 6.

FIG. 9 shows an example of the shape of the control gate 24 and the contact portion 622 in the case of a further increase in the number of bends in shape of the control gate 24 so as to enable further reliable inhibition of the intrusion of ultraviolet light through the portion A. Note that portions corresponding to those in FIG. 6 are given the same reference symbols as those of FIG. 6. Further, in the above embodiment, while only a cell transistor storing one bit information is covered by the light shield layer, in actually several bits worth of cell transistors are required for constituting the ROM for storing malfunctional addresses and it is possible to cover these cell transistors together by a common light shield layer.

FIG. 10 is an equivalent circuit diagram of the cell transistor of the ROM for storing malfunctional addresses shown in FIG. 6 to FIG. 9, wherein the drain terminal 61 side is supplied with a predetermined high potential, the source terminal 62 is used as the ground terminal, and the well 31 functions as a resistor connecting the drain terminal 61 and the drain region 21. Note that to reduce the resistance of the well 31, the width of the drain region 21, well 31, and drain terminal connection region 32 is usually made larger, though a smaller width is shown in FIG. 6 and FIG. 9.

According to the present invention, with just the application of a small-sized shield construction to the cell transistor of the ROM for storing fixed information, it is possible to reliably inhibit intrusion of ultraviolet light irradiated during erasure of the data of an EPROM proper and thus to reliably prevent erasure of fixed information, such as malfunctional addresses, set in the cell transistors of the ROM. Further, in the present invention, since a well construction formed in a CMOS type EPROM process is used, the desired shielding effect can be reliably achieved without any special additional process.

I claim:

1. A semiconductor memory device comprising:
   a substrate having one conductivity type;
   a read only memory element formed in said substrate for storing fixed information, said element having a control gate, a floating gate, a source region, and a drain region, both of said regions having an opposite conductivity type to that of said substrate;
   a first region having said one conductivity type which surrounds said element;
   a light shield layer, connected to said source region and said first region, for covering said element;
   a second region having said opposite conductivity type which is located outside of said first region for reading out a state of said drain region; and
   a well region having said opposite conductivity type, said well region linking said drain region and said second region, a part of said first region being formed in said well, wherein said fixed information is read out through said well region and said second region.

2. A semiconductor memory device according to claim 1, wherein said light shield layer is opened at the portion for taking out said control gate and said control gate is formed bent to match the connection portion of said light shield layer and said first region.

3. A semiconductor memory device according to claim 1, wherein said read only memory for storing fixed information is read only memory for storing a malfunctional address.

4. A semiconductor memory devie according to claim 1, wherein said read only memory for storing fixed information is a read only memory for storing hysteresis of a production process.

5. A semiconductor memory device according to claim 1, wherein said read only memory for storing fixed information is a read only memory for storing test data.

6. A semiconductor memory device according to claim 1, wherein said read only memory for storing fixed information is a read only memory for storing information regarding type or product number of the memory device itself.

* * * * *